US012740054B2

(12) United States Patent
Wu

(10) Patent No.: US 12,740,054 B2
(45) Date of Patent: Sep. 15, 2026

(54) SEMICONDUCTOR STRUCTURE AND METHOD OF FORMING THE SAME

(71) Applicant: NANYA TECHNOLOGY CORPORATION, New Taipei City (TW)

(72) Inventor: Chun-Heng Wu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 542 days.

(21) Appl. No.: 18/305,375

(22) Filed: Apr. 23, 2023

(65) Prior Publication Data

US 2024/0357798 A1 Oct. 24, 2024

(51) Int. Cl.
*H10B 12/00* (2023.01)

(52) U.S. Cl.
CPC ........... *H10B 12/482* (2023.02); *H10B 12/02* (2023.02)

(58) Field of Classification Search
CPC ..... H10B 12/482; H10B 12/315; H10B 12/02
See application file for complete search history.

(56) References Cited

U.S. PATENT DOCUMENTS

2018/0174971 A1* 6/2018 Song .................... H10B 12/033
2020/0168614 A1* 5/2020 Chung ................ H01L 21/7682
2020/0203354 A1* 6/2020 Lee ........................ H10B 12/02
2022/0115382 A1* 4/2022 Lee ...................... H10B 12/482
2022/0181457 A1* 6/2022 Yoon ...................... H10B 12/34

FOREIGN PATENT DOCUMENTS

CN 105280608 A 1/2016
TW 202234577 A 9/2022
TW 1799237 B 4/2023

* cited by examiner

*Primary Examiner* — Steven M Page

(74) *Attorney, Agent, or Firm* — CKC & Partners Co., LLC

(57) ABSTRACT

The semiconductor structure includes a substrate, a plurality of bitline structures on the substrate, a spacer structure on side walls of each of the plurality of bitline structures, a plurality of conductive structures on the substrate, and a dielectric layer between the plurality of bitline structures and the plurality of conductive structures. The spacer structure includes an inner sub-spacer, an outer sub-spacer, and an air gap between the inner sub-spacer and the outer sub-spacer. Each of the plurality of conductive structures is separated from the other by the plurality of bitline structures. A first portion of the dielectric layer in direct contact with the plurality of bitline structures has a first maximum height, a second portion of the dielectric layer in direct contact with the plurality of conductive structures has a second maximum height, and the first maximum height is larger than the second maximum height.

9 Claims, 10 Drawing Sheets

200

A plurality of bitline structures is formed on a substrate. ~201

A spacer structure is formed on each of the plurality of bitline structures, in which the spacer structure includes an inner sub-spacer, a center sub-spacer, and an outer sub-spacer. ~202

A polysilicon layer and a metal layer are formed between each of the plurality of bitline structures. ~203

The metal layer, the spacer structure, and each of the plurality of bitline structures are etched to form a plurality of first openings. ~204

The spacer structure is etched through the plurality of first openings with a vapor composition to form a plurality of second openings and to remove the center sub-spacer for forming an air gap, in which each of the plurality of second openings has a first maximum depth and a second maximum depth and the first maximum depth is larger than the second maximum depth. ~205

A spacer structure is formed on each of the plurality of bitline structures, in which the spacer structure includes an inner sub-spacer, a center sub-spacer, and an outer sub-spacer. ~206

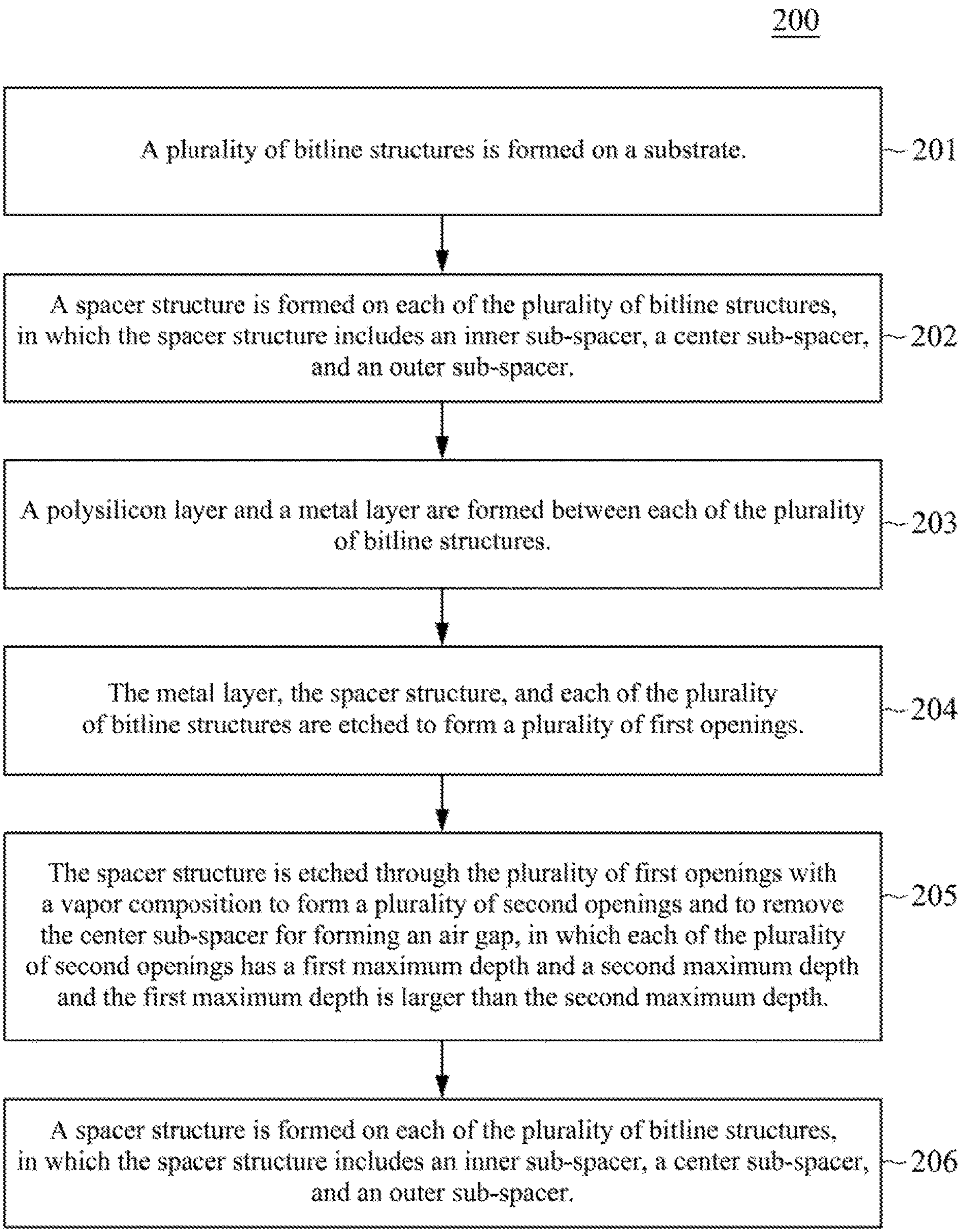

Fig. 3

SEMICONDUCTOR STRUCTURE AND METHOD OF FORMING THE SAME

BACKGROUND

Field of Invention

The present disclosure relates to a semiconductor structure and a method of forming the same.

Description of Related Art

As the scale of the semiconductor structure becomes smaller and smaller, process of forming the semiconductor structure becomes harder. Semiconductor memory devices, such as dynamic random-access memory (DRAM), used for storing digital data are fabricated to have structures with high aspect ratios. In these semiconductor memory devices, the memory cell is a unit storing a bit of data and is connected by the bitlines and wordlines to perform data writing and reading. When the space between the bitlines (or the wordlines) shrinks as the semiconductor memory devices become smaller, the fabrication between the bitlines (or the wordlines) is constrained by the limited space. For example, the deposition or etching of materials between the bitlines (or the wordlines) is hard to perform in these smaller spaces and leads to only partial deposition or etching. Partially deposition or etching affects the performance of the semiconductor memory devices and decreases the fabrication yields. Therefore, there is an urgent need of solving the problem mentioned above.

SUMMARY

The present disclosure provides a semiconductor structure. The semiconductor structure includes a substrate, a plurality of bitline structures, a spacer structure, a plurality of conductive structures, and a dielectric layer. The plurality of bitline structures is on the substrate. The spacer structure is on side walls of each of the plurality of bitline structures, in which the spacer structure includes an inner sub-spacer, an outer sub-spacer, and an air gap between the inner sub-spacer and the outer sub-spacer. The plurality of conductive structures is on the substrate, in which each of the plurality of conductive structures is separated from the other by the plurality of bitline structures. The dielectric layer is between the plurality of bitline structures and the plurality of conductive structures, in which a first portion of the dielectric layer that is in direct contact with the plurality of bitline structures has a first maximum height, a second portion of the dielectric layer that is in direct contact with the plurality of conductive structures has a second maximum height, and the first maximum height is larger than the second maximum height.

In some embodiments, the dielectric layer is in direct contact with the air gap of the spacer structure.

In some embodiments, an upper surface of the air gap of the spacer structure is lower than upper surfaces of the plurality of bitline structures.

In some embodiments, the plurality of conductive structures is in direct contact with active regions of the substrate.

In some embodiments, a portion of the spacer structure that is directly below the first portion of the dielectric layer has a first upper surface, a portion of each of the plurality of conductive structures that is directly below the second portion of the dielectric layer has a second upper surface, and the first upper surface is lower than the second upper surface.

In some embodiments, the inner sub-spacer of the spacer structure includes silicon nitride, and the outer sub-spacer of the spacer structure includes silicon nitride.

In some embodiments, the dielectric layer includes silicon nitride.

In some embodiments, each of the plurality of conductive structures includes a metal layer, a metal silicide layer, and a polysilicon layer from top to bottom.

In some embodiments, each of the plurality of bitline structures includes a dielectric layer, a metal layer, a metal nitride layer, and a polysilicon layer from top to bottom.

The present disclosure provides a method of forming semiconductor structure. The method includes the following operations. A plurality of bitline structures is formed on a substrate. A spacer structure is formed on side walls of each of the plurality of bitline structures, in which the spacer structure includes an inner sub-spacer, a center sub-spacer, and an outer sub-spacer, and the center sub-spacer is between the inner sub-spacer and the outer sub-spacer. A polysilicon layer and a metal layer are formed between each of the plurality of bitline structures, in which the metal layer is on the polysilicon layer. The metal layer, the spacer structure, and each of the plurality of bitline structures are etched to form a plurality of first openings, in which each of the plurality of first openings exposes a corresponding one of the plurality of bitline structures and the spacer structure. The spacer structure is etched through the plurality of first openings with a vapor composition to form a plurality of second openings and to remove the center sub-spacer for forming an air gap in the spacer structure, in which each of the plurality of second openings has a first maximum depth and a second maximum depth, the first maximum depth is closer to the plurality of bitline structures compared to the second maximum depth, and the first maximum depth is larger than the second maximum depth. A dielectric layer is formed in the plurality of second openings.

In some embodiments, a first portion of the dielectric layer in direct contact with the plurality of bitline structures has a first maximum height, a second portion of the dielectric layer in direct contact with the metal layer has a second maximum height, and the first maximum height is larger than the second maximum height.

In some embodiments, the vapor composition includes HF and $NH_3$, and a flow rate ratio of HF and $NH_3$ is in a range of 1:1 to 1:5.

In some embodiments, an etch selectivity of the vapor composition for the center sub-spacer of the spacer structure over the inner sub-spacer of the spacer structure is in a range of 1 to 500, and an etch selectivity of the vapor composition for the center sub-spacer of the spacer structure over the outer sub-spacer of the spacer structure is in a range of 1 to 500.

In some embodiments, etching the spacer structure through the plurality of first openings with the vapor composition is performed at a temperature in a range of 80° C. to 150° C.

In some embodiments, etching the spacer structure through the plurality of first openings with the vapor composition is performed at a pressure in a range of 1 Torr to 20 Torr.

In some embodiments, etching the spacer structure through the plurality of first openings with the vapor composition is performed in cycles, and each one of the cycles is from 5 seconds to 30 seconds.

In some embodiments, the inner sub-spacer of the spacer structure includes silicon nitride, the center sub-spacer of the spacer structure includes silicon dioxide, and the outer sub-spacer of the spacer structure includes silicon nitride.

In some embodiments, the dielectric layer is in direct contact with the air gap.

In some embodiments, an upper surface of the center sub-spacer of the spacer structure is lower than upper surfaces of the plurality of bitline structures.

In some embodiments, forming the polysilicon layer includes repeating cycles of depositing a first polysilicon layer and etching a portion of the first polysilicon layer, and depositing a second polysilicon layer after repeating the cycles.

The features, aspects, and advantages of the present disclosure are better understood by referring to the following detailed description. It is noted that both the foregoing general description and the following detailed description are merely illustrative and are intended to provide further explanations of the appended claims.

BRIEF DESCRIPTION OF THE DRAWINGS

The present disclosure is best understood from the following detailed description and the accompanying figures. It is noted that the elements in the figures may not be drawn to meet the exact scale. Some elements may be drawn with increased or decreased sizes for clarity of the discussion.

FIG. 3 is a flowchart of the method of forming the semiconductor structure according to some embodiments of the present disclosure.

DETAILED DESCRIPTION

Figure 1:
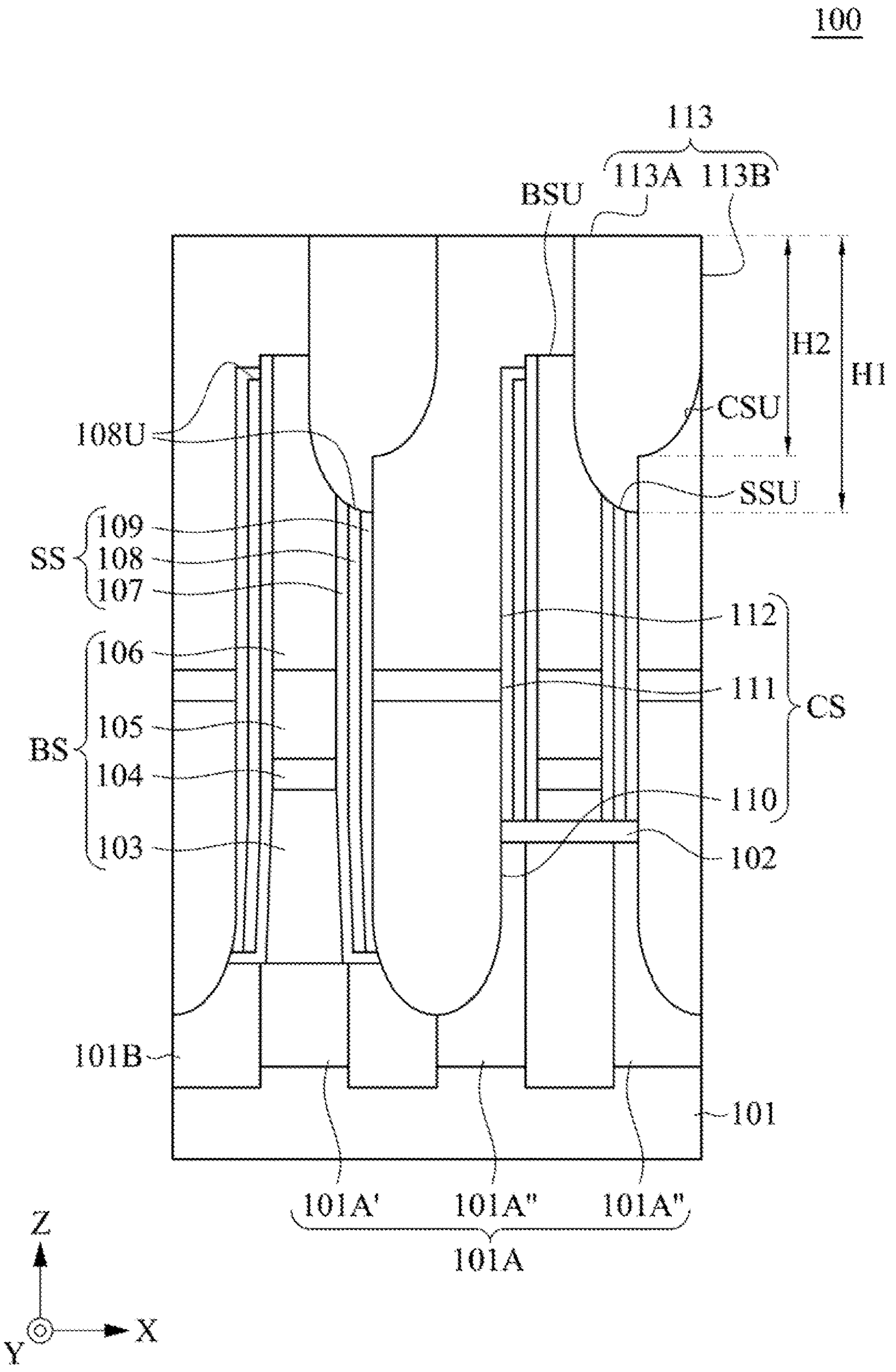
FIG. 1 is a schematic of the semiconductor structure in a sectional view according to some embodiments of the present disclosure.

To make the description of the present disclosure more detailed and complete, explanatory descriptions of the aspects and specific implementations of the embodiments are provided below. It is not to limit the embodiments of the present disclosure to only one form. The embodiments of the present disclosure can combine or be substituted with each other under beneficial circumstances. Other embodiments may be appended without further description or explanation.

Furthermore, spatially relative terms, such as below and above, etc., may be used in the present disclosure to describe the relationship of one element or feature to another element or feature in the drawings. In addition to the orientation depicted in the figures, spatially relative terms are intended to encompass different orientations of the device in use or operation. For example, the device may be otherwise oriented (eg, rotated 90 degrees or otherwise) and the spatially relative terms of this disclosure are to be interpreted accordingly. In this disclosure, unless otherwise indicated, the same element numbers in different figures refer to the same or similar elements formed from the same or similar materials by the same or similar methods.

The present disclosure provides a semiconductor structure. The semiconductor structure includes a substrate, a plurality of bitline structures, a spacer structure, a plurality of conductive structures, and a dielectric layer. The plurality of bitline structures is on the substrate. The spacer structure is on side walls of each of the plurality of bitline structures, in which the spacer structure includes an inner sub-spacer, an outer sub-spacer, and an air gap between the inner sub-spacer and the outer sub-spacer. The plurality of conductive structures is on the substrate, in which each of the plurality of conductive structures is separated from the other by the plurality of bitline structures. The dielectric layer is between the plurality of bitline structures and the plurality of conductive structures, in which a first portion of the dielectric layer that is in direct contact with the plurality of bitline structures has a first maximum height, a second portion of the dielectric layer that is in direct contact with the plurality of conductive structures has a second maximum height, and the first maximum height is larger than the second maximum height. The semiconductor structure of the present disclosure is discussed in detail in the following.

Figure 2:
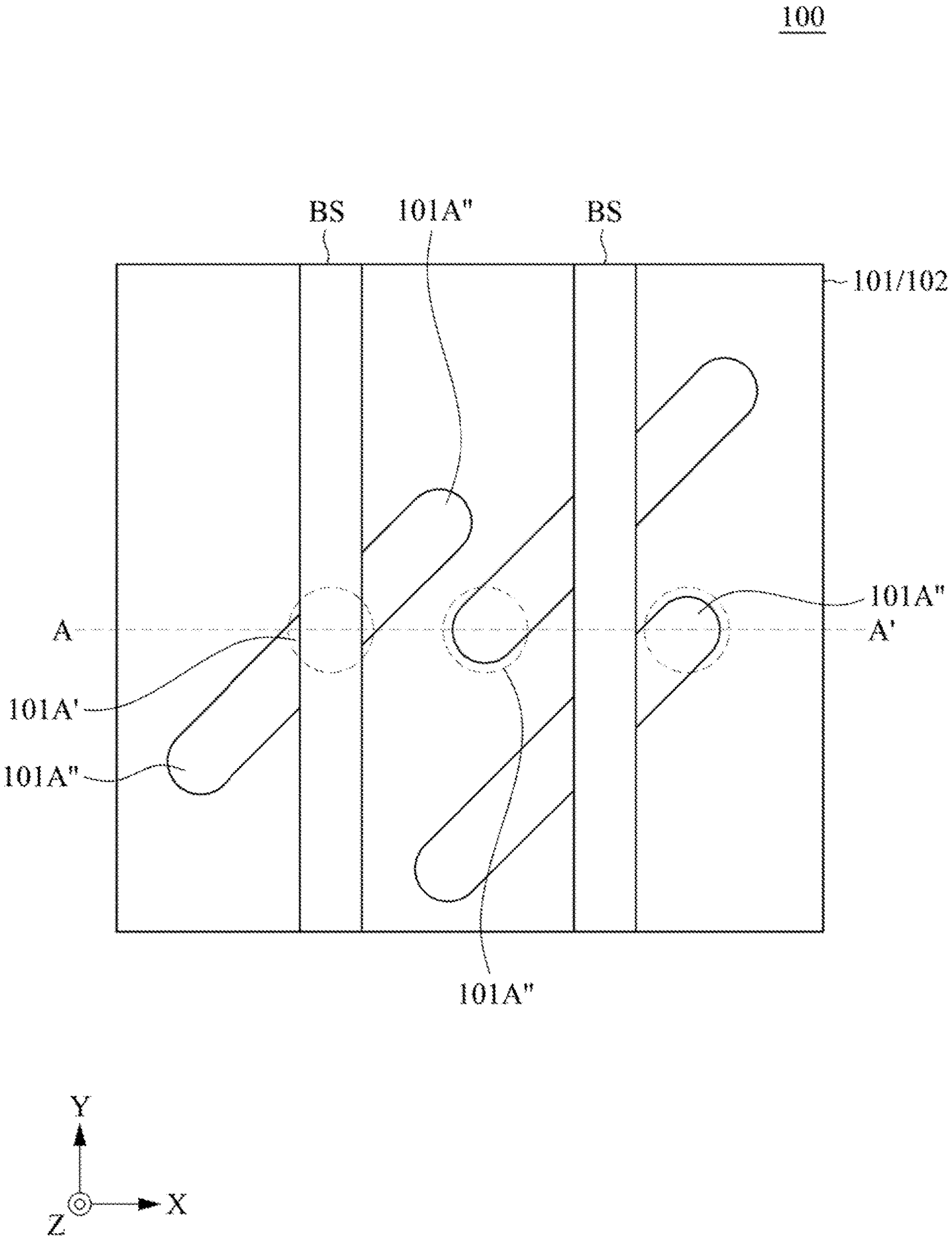
FIG. 2 is a schematic of the semiconductor structure in a top view according to some embodiments of the present disclosure.

FIGS. 1 and 2 are schematics of the semiconductor structure 100 according to some embodiments of the present disclosure. The sectional view of FIG. 1 is taken from the top view of FIG. 2 along line A-A'. It is noted that some elements in FIG. 1 may not be drawn in FIG. 2 for simplicity of the discussion. The semiconductor structure 100 includes a substrate 101, a plurality of bitline structures BS, a spacer structure SS, a plurality of conductive structures CS, and a dielectric layer 113. These elements in the semiconductor structure 100 are discussed in detail in the following.

In FIGS. 1 and 2, the substrate 101 includes a semiconductor material. In some embodiments, the semiconductor material includes an elemental semiconductor material, such as carbon, monocrystalline silicon, polycrystalline silicon, amorphous silicon, germanium, tin, sulfur, selenium, tellurium, or the like; a compound semiconductor material, such as silicon carbide, boron nitride, aluminum nitride, gallium nitride, gallium phosphide, gallium arsenide, indium phosphide, indium arsenide, indium antimonide, zinc oxide, or the like; an alloy semiconductor material, such as SiGe, AlGaAs, InGaAs, InGaP, AlInAs, GaAsP, AlGaN, InGaN, AlGaInP, or the like; or combinations thereof.

In FIGS. 1 and 2, the substrate 101 includes active regions 101A. It is noted that each of the active regions 101A is divided into a region 101A' and a region 101A" for a better understanding of the element alignment in FIG. 1 and FIG. 2. The active regions 101A are regions of the substrate 101 doped with the dopant, such as the N-type dopant or the P-type dopant. The active regions 101A are also referred to as source/drain regions in the transistors (not shown in the figures) of the memory cells in a semiconductor memory device. In some embodiments, the active regions 101A are N-type doping regions doped with an N-type dopant, such as phosphorus, arsenic, or the like. In some embodiments, the active regions 101A are P-type doping regions doped with a P-type dopant, such as boron, gallium, indium, or the like. In some embodiments, forming the active regions 101A includes performing an ion implantation process to implant the N-type dopant or the P-type dopant into the substrate 101.

In FIGS. 1 and 2, the substrate 101 includes isolation regions 101B. The isolation regions 101B are regions of the substrate 101 having an electrically insulating material or a low-k dielectric material. The isolation regions 101B are between each of the active regions 101A. Each of the active regions 101A is separated by the isolation regions 101B. Therefore, current leakage between two adjacent electric components, such as the transistors, is avoided. In some embodiments, the electrically insulating material or the low-k dielectric material includes silicon dioxide. In some embodiments, forming the isolation regions 101B includes etching the substrate 101 to form trenches, and filling the trenches with the electrically insulating material or the low-k dielectric material to form the isolation regions 101B in the substrate 101.

In FIGS. 1 and 2, an isolation layer 102 is on the substrate 101. The isolation layer 102 includes an electrically insulating material or a low-k dielectric material. The isolation layer 102 avoids unintended short circuits between, for example, the plurality of bitline structures BS and the plurality of conductive structures CS. In some embodiments, the electrically insulating material or the low-k dielectric material includes silicon nitride. In some embodiments, forming the isolation layer 102 includes performing chemical vapor deposition or physical vapor deposition on the substrate 101.

In FIGS. 1 and 2, the plurality of bitline structures BS is on the substrate 101. It is noted that the number of the plurality of bitline structures BS may not be limited to the number as shown in FIGS. 1 and 2. The semiconductor structure 100 shown in FIGS. 1 and 2 may be repeated along a direction X, a direction Y, or a combination thereof, in which the direction X and the direction Y are perpendicular to each other and are on a plane parallel to the substrate 101. Therefore, the semiconductor structure 100 shown in FIGS. 1 and 2 may form a two-dimensional array. In addition, a direction Z is vertical to the substrate 101 and is perpendicular to the direction X and the direction Y. It is also noted that the bitline structures on the left and right of FIG. 1 are two different cross-sections (refer to FIG. 2) of the bitline structures. In other words, the bitline structures on the left and right of FIG. 1 are basically the same among the plurality of bitline structures BS, except for a shift in the position on the substrate 101.

In FIGS. 1 and 2, the plurality of bitline structures BS is in direct contact with the active regions 101A of the substrate 101 to perform data writing and reading in a semiconductor memory device. It is noted that the plurality of bitline structures BS is not limited to the form burying in the substrate 101 as shown in FIGS. 1 and 2. In other words, the plurality of bitline structures BS is not limited to the form of the bottom surfaces of the plurality of bitline structures BS lower than the top surface of the substrate 101. In some embodiments, the plurality of bitline structures BS may be entirely protruding above the substrate 101 (not shown in the figures). In this situation, the bottom surfaces of the plurality of bitline structures BS are in direct contact with the top surface of the substrate 101. In the case of the plurality of bitline structures BS shown in FIGS. 1 and 2, forming the plurality of bitline structures BS includes etching portions of the active regions 101A of the substrate 101 to form trenches, and deposing the materials of the plurality of bitline structures BS in the trenches. When the plurality of bitline structures BS is buried in the substrate 101, more components can be formed in a unit area of the semiconductor structure 100, thereby increasing the component density for forming a smaller semiconductor structure 100.

In FIGS. 1 and 2, each of the plurality of bitline structures BS includes a polysilicon layer 103, a metal nitride layer 104, a metal layer 105, and a dielectric layer 106 from bottom to top. The metal layer 105 conducts the electric current to the polysilicon layer 103 that is in direct contact with the active regions 101A of the substrate 101 to perform data writing and reading. The metal nitride layer 104 reduces the electrical resistance between the polysilicon layer 103 and the metal layer 105. The dielectric layer 106 is an insulator cover of the plurality of bitline structures BS and can be a hard mask layer in an etching process. In some embodiments, the polysilicon layer 103 includes polysilicon. In some embodiments, the metal nitride layer 104 preferably includes titanium nitride. In some embodiments, the metal layer 105 includes metal, such as tungsten, titanium, tantalum, ruthenium, iridium, platinum, rhodium, molybdenum, aluminum, copper, or the like, in which tungsten is preferable for having low electrical resistance and low contact resistance. In some embodiments, the dielectric layer 106 includes silicon nitride. In some embodiments, forming the polysilicon layer 103, the metal nitride layer 104, the metal layer 105, and the dielectric layer 106 include performing chemical vapor deposition or physical vapor deposition.

In FIGS. 1 and 2, the spacer structure SS is on side walls of each of the plurality of bitline structures BS. The spacer structure SS is electrically insulated so the spacer structure SS insulates one of the plurality of bitline structures BS from the other one of the plurality of bitline structures BS, and also insulates the plurality of bitline structures BS from the plurality of conductive structures CS. In addition, due to the possible unexpected diffusion of the active regions 101A, the spacer structure SS located on the substrate 101 and beside the active regions 101A avoids this diffusion to affect other components in the semiconductor structure 100. The spacer structure SS includes an inner sub-spacer 107, an air gap 108, and an outer sub-spacer 109. The inner sub-spacer 107 is in direct contact with the plurality of bitline structures BS and between the plurality of bitline structures BS and the air gap 108. The air gap 108 is between the inner sub-spacer 107 and the outer sub-spacer 109. The outer sub-spacer 109 is in direct contact with the plurality of conductive structures CS and between the air gap 108 and the plurality of conductive structures CS. In some embodiments, the inner sub-spacer 107 includes nitride, e.g., silicon nitride, the air gap 108 includes air to reduce parasitic capacitance, and the outer sub-spacer 109 includes nitride, e.g., silicon nitride. In some embodiments, an upper surface 108U of the air gap 108 is lower than upper surfaces BSU of the plurality of bitline structures BS. When the upper surface 108U of the air gap 108 is lower than the upper surfaces BSU of the plurality of bitline structures BS, the space between one of the plurality of bitline structures BS to the near one of the plurality of bitline structures BS is larger. Therefore, the formation of the plurality of conductive structures CS between the plurality of bitline structures BS is easier to implement.

In FIGS. 1 and 2, the plurality of conductive structures CS is on the substrate 101, in which each of the plurality of conductive structures CS is separated from the other by the plurality of bitline structures BS. The plurality of conductive structures CS is in direct contact with the active regions 101A of the substrate 101 to perform charging and discharging to the capacitors (not shown in the figures) in the memory cells of a semiconductor memory device. Each of the plurality of conductive structures CS includes a polysilicon layer 110, a metal silicide layer 111, and a metal layer 112 from bottom to top. The electric current is flowing between the metal layer 112 and the polysilicon layer 110, in which the polysilicon layer 110 is in direct contact with the active regions 101A of the substrate 101. The metal silicide layer 111 reduces the electrical resistance between the polysilicon layer 110 and the metal layer 112. In some embodiments, the polysilicon layer 110 includes polysilicon. In some embodiments, the metal silicide layer 111 preferably includes cobalt silicide. In some embodiments, the metal layer 112 includes metal, such as tungsten, titanium, tantalum, ruthenium, iridium, platinum, rhodium, molybdenum, aluminum, copper, or the like, in which tungsten is preferable for having low electrical resistance and low contact resistance. In some embodiments, forming the polysilicon layer 110, the metal silicide layer 111, and the metal layer 112 include performing chemical vapor deposition or physical vapor deposition.

In FIGS. 1 and 2, the dielectric layer 113 is between the plurality of bitline structures BS and the plurality of conductive structures CS. The dielectric layer 113 is an electrical insulator between the plurality of bitline structures BS and the plurality of conductive structures CS. The dielectric layer 113 is in direct contact with the air gap 108 of the spacer structure SS to seal the air inside the air gap 108. A first portion 113A of the dielectric layer 113 that is in direct contact with the plurality of bitline structures BS has a first maximum height H1 (i.e., the maximum height of the first portion 113A), a second portion 113B of the dielectric layer 113 that is in direct contact with the plurality of conductive structures CS has a second maximum height H2 (i.e., the maximum height of the second portion 113B), and the first maximum height H1 is larger than the second maximum height H2. A portion of the spacer structure SS that is directly below the first portion 113A of the dielectric layer 113 has a first upper surface SSU, a portion of each of the plurality of conductive structures CS that is directly below the second portion 113B of the dielectric layer 113 has a second upper surface CSU, and the first upper surface SSU is lower than the second upper surface CSU. When the first maximum height H1 is larger than the second maximum height H2 and/or the first upper surface SSU is lower than the second upper surface CSU, more air is sealed in the air gap 108 of the spacer structure SS to reduce parasitic capacitance. Details will be explained further in the method of forming the semiconductor structure 100. In some embodiments, the dielectric layer 113 includes silicon nitride.

The present disclosure also provides a method 200 of forming the semiconductor structure 100 described above. It is noted that some details described above may not be repeatedly described again in the following so please refer to the details described above for further explanation if necessary. The method 200 includes the following operations. A plurality of bitline structures is formed on a substrate. A spacer structure is formed on side walls of each of the plurality of bitline structures, in which the spacer structure includes an inner sub-spacer, a center sub-spacer, and an outer sub-spacer, and the center sub-spacer is between the inner sub-spacer and the outer sub-spacer. A polysilicon layer and a metal layer are formed between each of the plurality of bitline structures, in which the metal layer is on the polysilicon layer. The metal layer, the spacer structure, and each of the plurality of bitline structures are etched to form a plurality of first openings, in which each of the plurality of first openings exposes a corresponding one of the plurality of bitline structures and the spacer structure. The spacer structure is etched through the plurality of first openings with a vapor composition to form a plurality of second openings and to remove the center sub-spacer for forming an air gap in the spacer structure, in which each of the plurality of second openings has a first maximum depth and a second maximum depth, the first maximum depth is closer to the plurality of bitline structures compared to the second maximum depth, and the first maximum depth is larger than the second maximum depth. A dielectric layer is formed in the plurality of second openings. The method 200 of forming the semiconductor structure 100 of the present disclosure is discussed in detail in the following.

FIG. 3 is a flowchart of the method 200 to form the semiconductor structure 100. FIGS. 4, 5A, 6, 7, 8A, 1, and 2 are schematics of the structures in the progress of forming the semiconductor structure 100. Please refer to FIGS. 4, 5A, 6, 7, 8A, 1, and 2 when reading FIG. 3. In FIG. 3, the method 200 includes an operation 201, an operation 202, an operation 203, an operation 204, an operation 205, and an operation 206. These operations are discussed in detail in the following.

Figure 4:
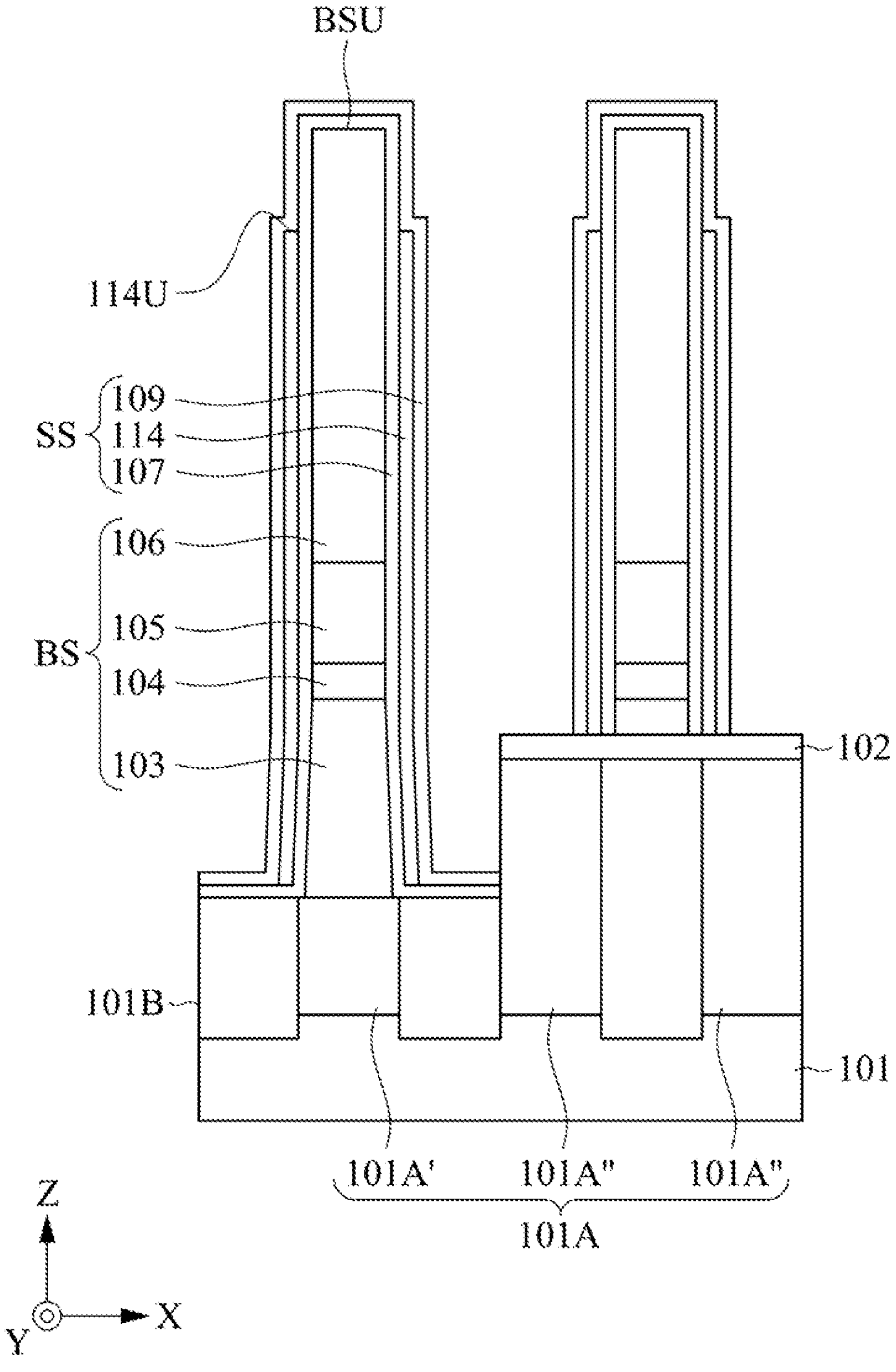
FIGS. 4, 5A, 6, 7, and 8A are schematics of the structures in the progress of forming the semiconductor structure according to some embodiments of the present disclosure.

In the operation 201 of FIG. 3, also refer to FIG. 4, the plurality of bitline structures BS is formed on the substrate 101. In some embodiments, portions of the active regions 101A of the substrate 101 are etched to form trenches. The polysilicon layer 103 is deposited into the trenches and on the substrate 101. The metal nitride layer 104 is deposited on the polysilicon layer 103. The metal layer 105 is deposited on the metal nitride layer 104. The dielectric layer 106 is deposited on the metal layer 105. The polysilicon layer 103, the metal nitride layer 104, the metal layer 105, and the dielectric layer 106 are etched with a photoresist layer (not shown in the figures) on the dielectric layer 106 to form separated bitline structures which is the plurality of bitline structures BS shown in FIG. 4.

In the operation 202 of FIG. 3, also refer to FIG. 4, the spacer structure SS is formed on side walls of each of the plurality of bitline structures BS, in which the spacer structure SS includes an inner sub-spacer 107, a center sub-spacer 114, and an outer sub-spacer 109, and the center sub-spacer 114 is between the inner sub-spacer 107 and the outer sub-spacer 109. The center sub-spacer 114 will form the air gap 108 in the operation 205. An upper surface 114U of the center sub-spacer 114 is lower than upper surfaces BSU of the plurality of bitline structures BS. When the upper surface 114U of the center sub-spacer 114 is lower than the upper surfaces BSU of the plurality of bitline structures BS, the space between one of the plurality of bitline structures BS to the near one of the plurality of bitline structures BS is larger. Therefore, the formation of the plurality of conductive structures CS between the plurality of bitline structures BS in the operation 203 is easier to implement. In some embodiments, the center sub-spacer 114 includes oxide, e.g., silicon dioxide. In some embodiments, the inner sub-spacer 107 is conformally formed on the plurality of bitline structures BS by atomic layer deposition. The center sub-spacer 114 is conformally formed on the inner sub-spacer 107 by atomic layer deposition and later etched to have the upper surface 114U lower than the upper surfaces BSU of the plurality of bitline structures BS. The outer sub-spacer 109 is conformally formed on the center sub-spacer 114 and the inner sub-spacer 107 by atomic layer deposition.

Figure 5A:
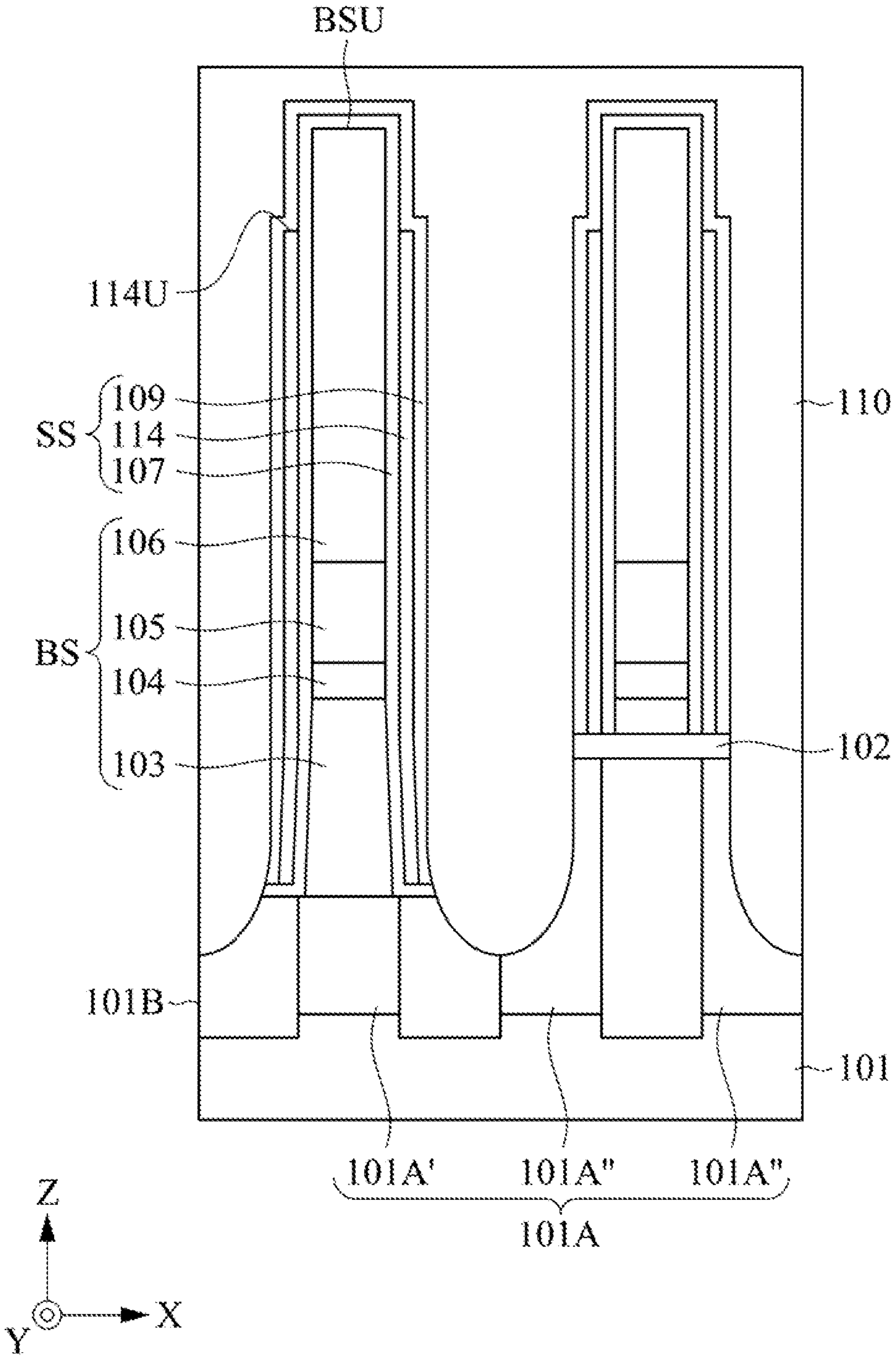
Figure 5B:
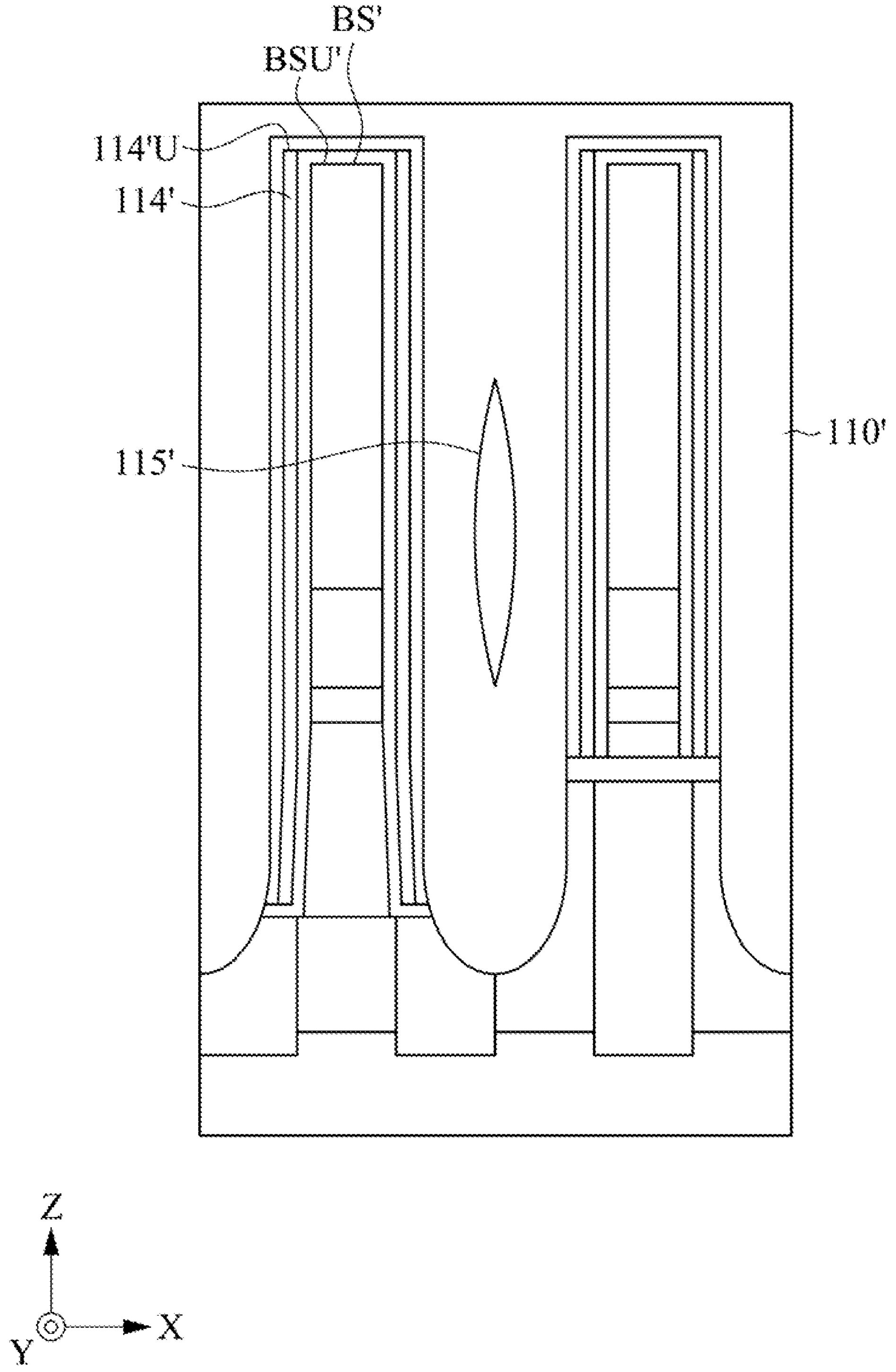
FIG. 5B is a schematic of an uncompleted formation of the polysilicon layer according to some comparative embodiments of the present disclosure.
Figure 6:
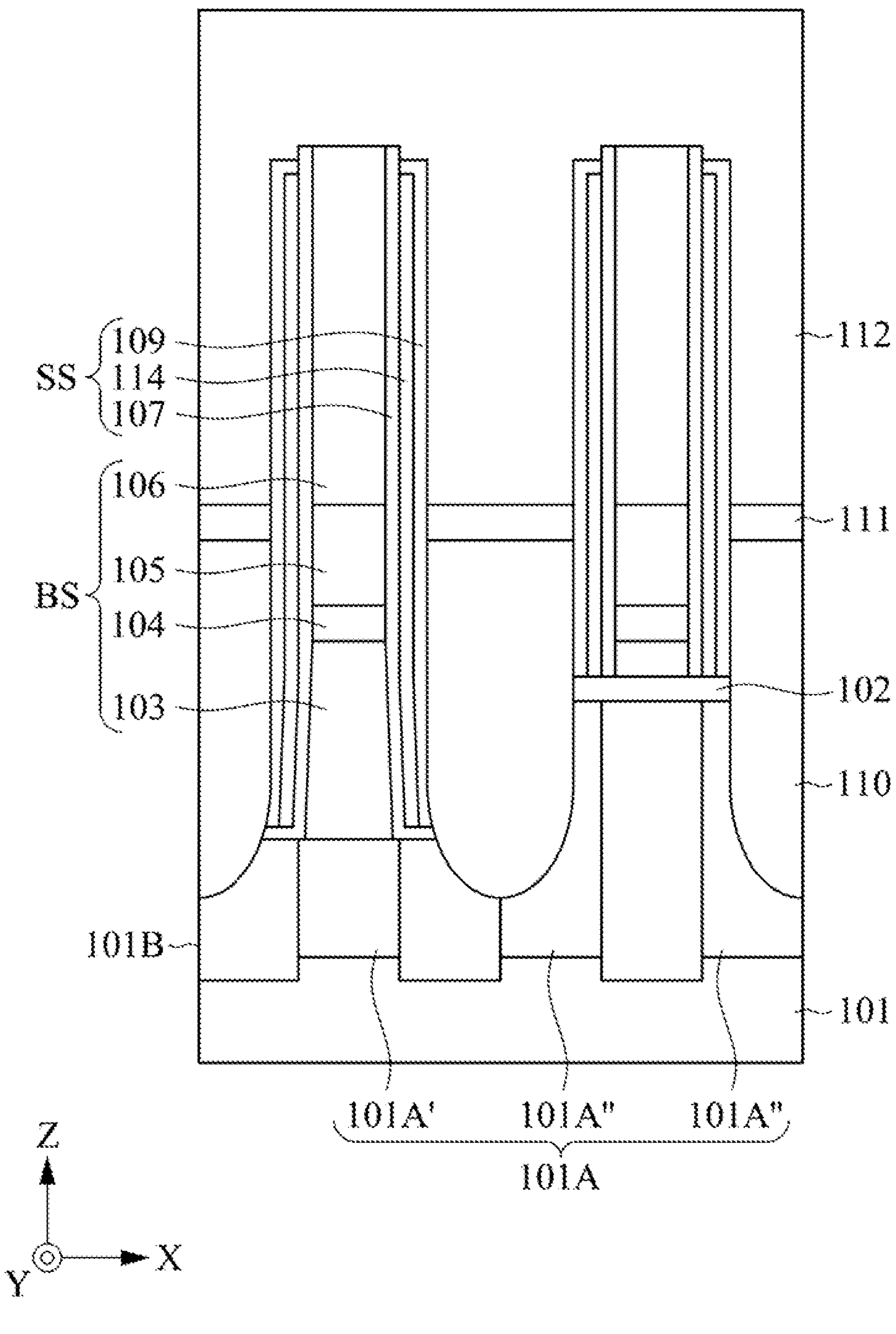

In the operation 203 of FIG. 3, also refer to FIGS. 5A and 6 the polysilicon layer 110 and the metal layer 112 are formed between each of the plurality of bitline structures BS, in which the metal layer 112 is on the polysilicon layer 110. In some embodiments, the metal silicide layer 111 is formed between the metal layer 112 and the polysilicon layer 110 to reduce the electrical resistance. When the upper surface 114U of the center sub-spacer 114 is lower than the upper surfaces BSU of the plurality of bitline structures BS, the space between one of the plurality of bitline structures BS to the near one of the plurality of bitline structures BS is larger. Therefore, the formation of the polysilicon layer 110, the metal silicide layer 111, and the metal layer 112 is easier to implement even when the distance between one of the plurality of bitline structures BS to the near one of the plurality of bitline structures BS is small. In other words, an uncompleted deposition or etching of the polysilicon layer 110, the metal silicide layer 111, and the metal layer 112 between the plurality of bitline structures BS is avoided, thereby increasing the production yield of the semiconductor structure 100. FIG. 5B is an example of an uncompleted formation of the polysilicon layer 110' according to some comparative embodiments of the present disclosure. In FIG. 5B, the upper surface 114'U of the center sub-spacer 114' is not lower or even higher than the upper surfaces BSU' of the plurality of bitline structures BS' so the space between one of the plurality of bitline structures BS' to the near one of the plurality of bitline structures BS' is small. In other words, the formation of the polysilicon layer 110' between the plurality of bitline structures BS' in FIG. 5B is hard to implement, which even causes an empty space 115' formed in the polysilicon layer 110'.

Continue the operation 203 of FIG. 3 and also refer to FIGS. 5A and 6. Portions of the active regions 101A and isolation regions 101B that are between the plurality of bitline structures BS are etched to form trenches. The polysilicon layer 110 is deposited into the trenches and on the substrate 101. In some embodiments, forming the polysilicon layer 110 includes repeating cycles of depositing a first polysilicon layer and etching a portion of the first polysilicon layer, and depositing a second polysilicon layer after repeating the cycles to form the polysilicon layer 110. By repeating the cycles of depositing and etching, an uncompleted deposition of the polysilicon layer 110 between the plurality of bitline structures BS is also avoided (refer to FIG. 5B). The metal silicide layer 111 is deposited on the polysilicon layer 110. The metal layer 112 is deposited on the metal silicide layer 111. It is noted that since there may be several etching process in the operation 203, top of the spacer structures SS and the plurality of bitline structures BS shown in FIG. 5A may be etched as well to form the spacer structures SS and the plurality of bitline structures BS shown in FIG. 6. Therefore, the heights of the spacer structures SS and the plurality of bitline structures BS are smaller and the plurality of bitline structures BS is exposed from the inner sub-spacer 107 and the outer sub-spacer 109 after the operation 203.

Figure 7:
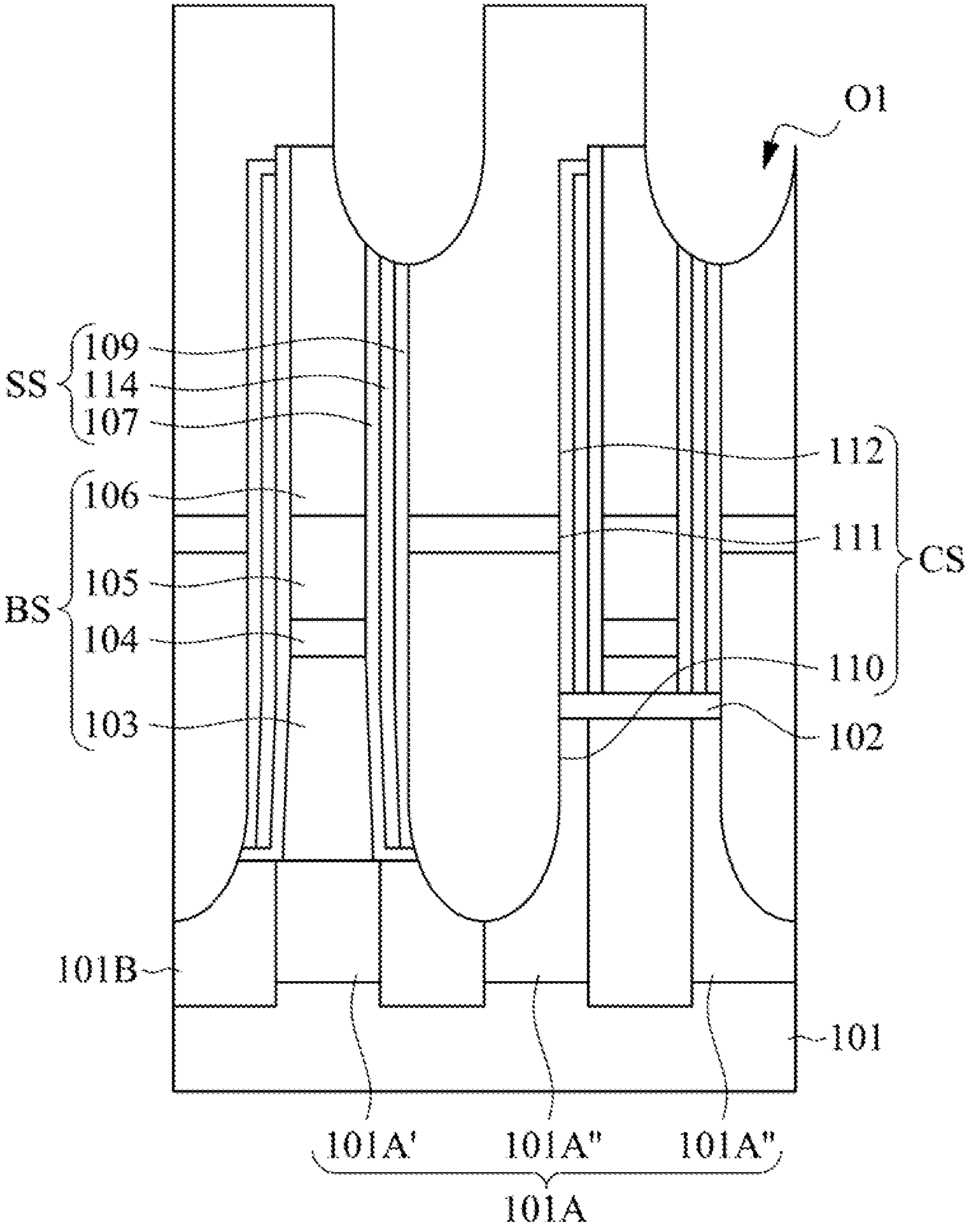

In the operation 204 of FIG. 3, also refer to FIG. 7, The metal layer 112, the spacer structure SS, and each of the plurality of bitline structures BS are etched to form a plurality of first openings O1, in which each of the plurality of first openings O1 exposes a corresponding one of the plurality of bitline structures BS and the spacer structure SS. The plurality of first openings O1 separate one of the plurality of conductive structures CS from the other one of the plurality of conductive structures CS. In some embodiments, the metal layer 112 is etched with a photoresist layer (not shown in the figures) on the metal layer 112 to form separated conductive structures which is the plurality of conductive structures CS shown in FIG. 6.

Figure 8A:
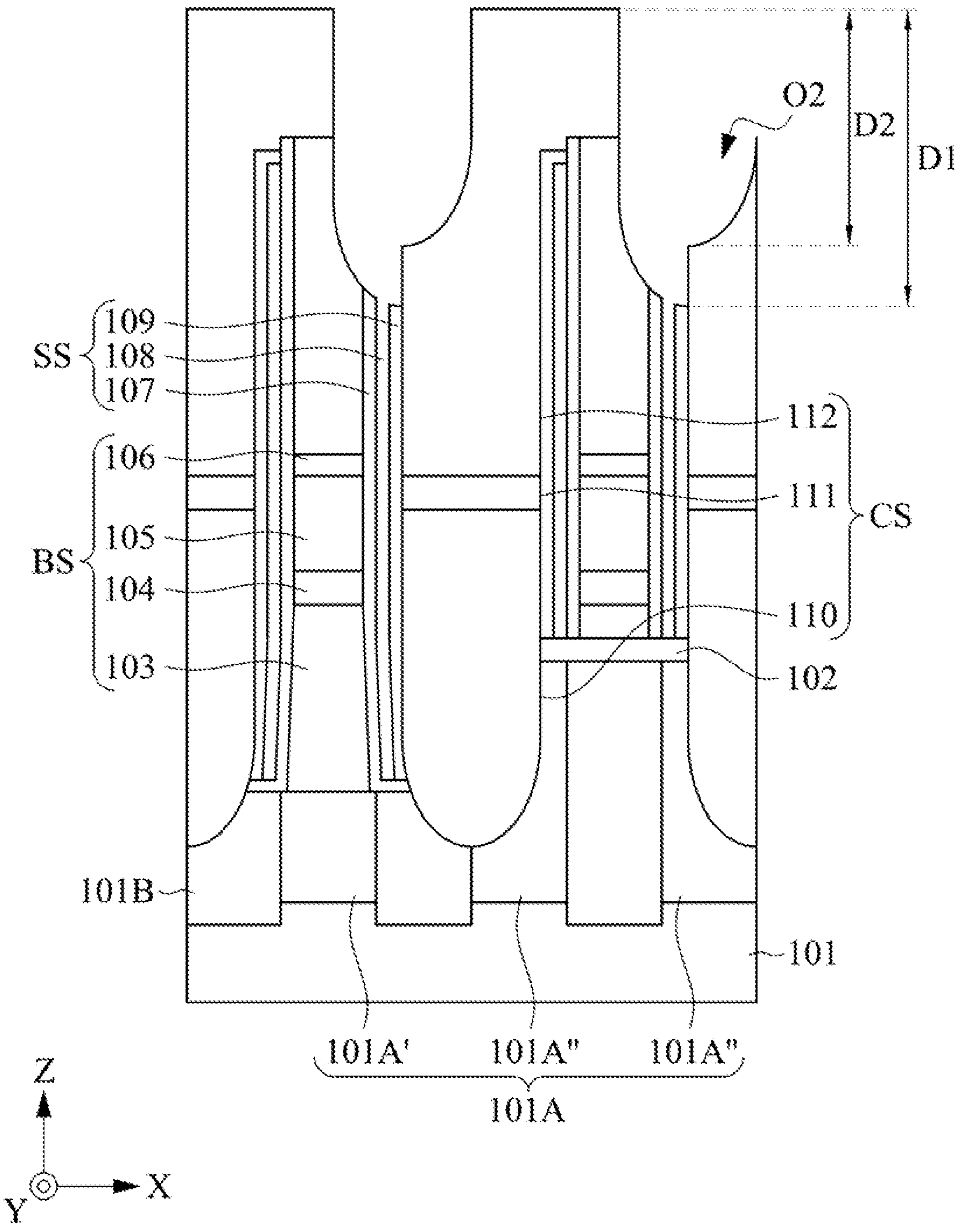
Figure 8B:
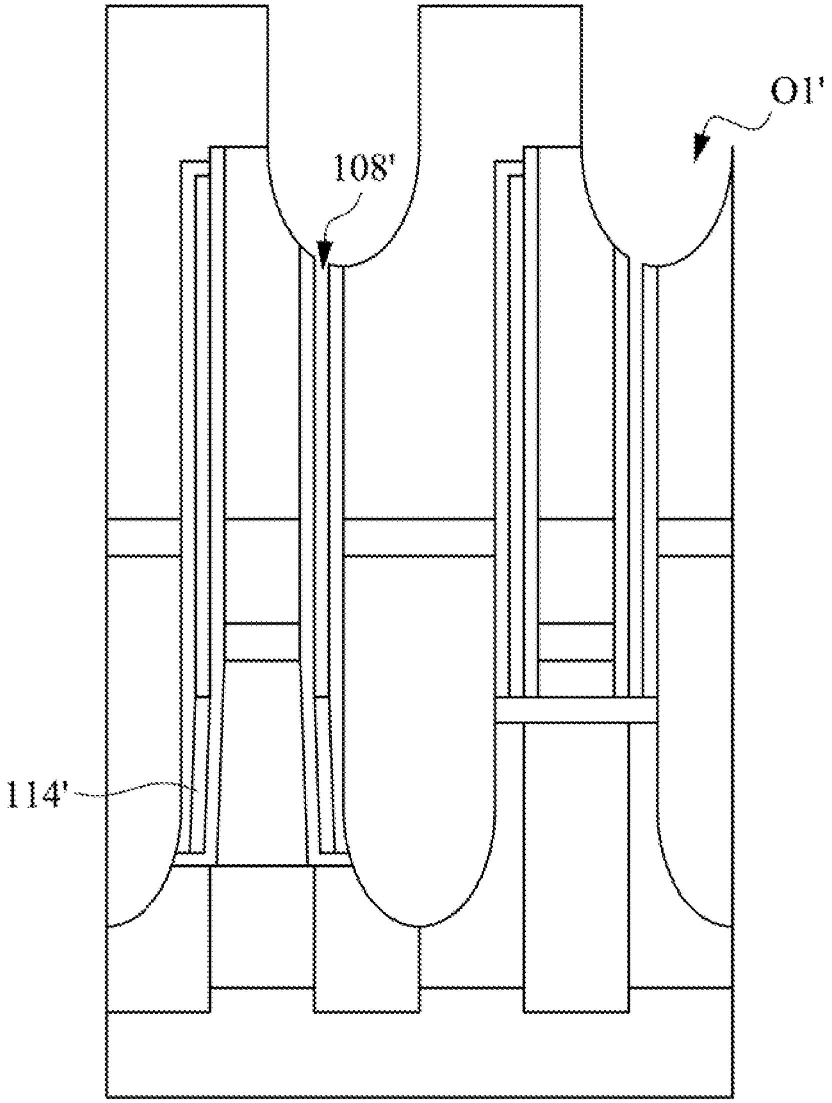
FIG. 8B is a schematic of an uncompleted etching of the center sub-spacer according to some comparative embodiments of the present disclosure.

In the operation 205 of FIG. 3, also refer to FIG. 8A, the spacer structure SS is etched through the plurality of first openings O1 with a vapor composition to form a plurality of second openings O2 and to remove the center sub-spacer 114 for forming the air gap 108 in the spacer structure SS. Each of the plurality of second openings O2 is divided into two sub-openings, The sub-opening closer to the plurality of bitline structures BS has a maximum height labeled as a first maximum depth D1 in FIG. 8A, and the sub-opening farther away from the plurality of bitline structures BS has a maximum height labeled as a second maximum depth D2 in FIG. 8A The first maximum depth D1 is closer to the plurality of bitline structures BS compared to the second maximum depth D2, and the first maximum depth D1 is larger than the second maximum depth D2. Since the width of the center sub-spacer 114 is relatively small, e.g., only several nanometers, etching the center sub-spacer 114 to form a slit of the air gap 108 is not easy to implement. However, by forming the plurality of second openings O2, the area of the spacer structure SS exposed for etching is larger and therefore an uncompleted etching of the center sub-spacer is avoided. FIG. 8B is an example of an uncompleted etching of the center sub-spacer 114' according to some comparative embodiments of the present disclosure. In FIG. 8B, the plurality of second openings is not formed and the center sub-spacer 114' is etched by any conventional method rather that the vapor composition of the present disclosure. Since the area of the spacer structure exposed in the plurality of first openings O1 is small, only partial center sub-spacer 114' is etched to form a smaller air gap 108' on the rest of the center sub-spacer 114' (refer to FIG. 8B). In this case, the ability of the air gap 108' to reduce parasitic capacitance is minimized.

Continue the operation 205 of FIG. 3 and also refer to FIG. 8A. The vapor composition provides comparable etch rates of the inner sub-spacer 107, the outer sub-spacer 109, and the center sub-spacer 114 by slowing down the etching of the center sub-spacer 114 and speeding up the etching of the inner sub-spacer 107 and the outer sub-spacer 109, thereby increasing the exposed portion of the center sub-spacer 114 between the inner sub-spacer 107 and the outer sub-spacer 109 during the process of etching. Therefore, the etching of a small slit of the center sub-spacer 114 can be fully conducted without an uncompleted etching of the center sub-spacer 114 (refer to FIG. 8B). In some embodiments, a preferable etch selectivity of the vapor composition for the center sub-spacer 114 over the inner sub-spacer 107 is in a range of 1 to 500, e.g., 1, 5, 10, 20, 50, 100, 150, 200, 250, 300, 350, 400, or 500, and a preferable etch selectivity of the vapor composition for the center sub-spacer 114 over the outer sub-spacer 109 is in a range of 1 to 500, e.g., 1, 5, 10, 20, 50, 100, 150, 200, 250, 300, 350, 400, or 500. Etch selectivity is the ratio of the etch rate of one material to the etch rate of another material. In some embodiments, the lower above-mentioned etch selectivity contributes more exposed area or volume of the center sub-spacer 114 for etching. In some embodiments, the vapor composition includes HF and $NH_3$. In some embodiments, a preferable flow rate ratio of HF and $NH_3$ is in a range of 1:1 to 1:5, e.g., 1:1, 1:2, 1:3, 1:4, or 1:5, for example, HF having 100 sccm and $NH_3$ having 100 sccm to 500 sccm, or for example, HF having 200 sccm and $NH_3$ having 200 sccm to 1000 sccm. In some embodiments, a preferable volume ratio of HF and $NH_3$ is in a range of 1:1 to 1:5, e.g., 1:1, 1:2, 1:3, 1:4, or 1:5. A byproduct, ammonium silicofluoride ($(NH_4)_2SiF_6$), is formed during the etching and this byproduct inhibits the etching of the inner sub-spacer 107 and the outer sub-spacer 109. To fasten the removal of the byproduct for speeding up the etching of the inner sub-spacer 107 and the outer sub-spacer 109, the etching is performed at a temperature in a range of 80° C. to 150° C., e.g., 80° C., 90° C., 100° C., 110° C., 120° C., 130° C., 140° C., or 150° C., and at a pressure in a range of 1 Torr to 20 Torr, e.g., 1 Torr, 5 Torr, 10 Torr, 15 Torr, or 20 Torr, to sublimate the byproduct faster. In some embodiments, the vapor composition further includes $N_2$, Ar, or a combination thereof to help to adjust the pressure to the above-mentioned values. In addition, the above-mentioned temperature also slows down the etching of the center sub-spacer 114 since the etching of the center sub-spacer 114 is an exothermic reaction. In addition, the etching is performed in cycles, and each one of the cycles is from 5 seconds to 30 seconds, e.g., 5 seconds, 10 seconds, 15 seconds, 20 seconds, 25 seconds, and 30 seconds, to obtain larger widths of the plurality of second openings O2. In some embodiments, the reactions during the etching include $SiO_2(s)+6HF(g)+2NH_3\ (g)\rightarrow(NH_4)_2SiF_6(s)+2H_2O$, and $(NH_4)_2SiF_6(s)\rightarrow SiF_4(g)+2NH_3(g)+2HF(g)$.

In the operation 206 of FIG. 3, also refer to FIGS. 8A and 1, the dielectric layer 113 is formed in the plurality of second openings O2 to seal the air inside the air gap 108 and act as an electrical insulator between the plurality of bitline structures BS and the plurality of conductive structures CS. In some embodiments, forming the dielectric layer 113 includes performing chemical vapor deposition or physical vapor deposition. After the operation 206, the semiconductor structure 100 shown in FIG. 1 is formed.

The semiconductor structure and the method of forming the same have a larger air gap formed on the side walls of the plurality of bitline structures to reduce the parasitic capacitance. The plurality of conductive structures is formed between the plurality of bitline structures without unexpected empty space in the plurality of conductive structures and/or between the plurality of conductive structures and the plurality of bitline structures. Therefore, the performance of the semiconductor structure of the present disclosure is improved and the yield of the semiconductor structure is increased.

The present disclosure is described in considerable detail with some embodiments. Other embodiments may be feasible. The scope and spirit of the claims that are appended should not be limited only to the description of the embodiments in the present disclosure.

For one skilled in the art, the present disclosure may be modified and changed as long as not departing from the spirit and scope of the present disclosure. If the modifications and changes are within the scope and spirit of the claims that are appended, they are covered by the present disclosure.

What is claimed is:

1. A semiconductor structure comprising:

a plurality of bitline structures on a substrate;

a spacer structure on side walls of each of the plurality of bitline structures, wherein the spacer structure comprises an inner sub-spacer, an outer sub-spacer, and an air gap between the inner sub-spacer and the outer sub-spacer;

a plurality of conductive structures on the substrate, wherein each of the plurality of conductive structures is separated from the other by the plurality of bitline structures; and a dielectric layer between the plurality of bitline structures and the plurality of conductive structures, wherein a first portion of the dielectric layer that is in direct contact with the plurality of bitline structures has a first maximum height, a second portion of the dielectric layer that is in direct contact with the plurality of conductive structures has a second maximum height, and the first maximum height is larger than the second maximum height;

wherein an upper surface of the air gap that is directly below the first portion of the dielectric layer is higher than an upper surface of the outer sub-spacer that is directly below the first portion of the dielectric layer.

2. The semiconductor structure of claim 1, wherein the dielectric layer is in direct contact with the air gap of the spacer structure.

3. The semiconductor structure of claim 1, wherein an upper surface of the air gap of the spacer structure is lower than upper surfaces of the plurality of bitline structures.

4. The semiconductor structure of claim 1, wherein the plurality of conductive structures is in direct contact with active regions of the substrate.

5. The semiconductor structure of claim 1, wherein a portion of the spacer structure that is directly below the first portion of the dielectric layer has a first upper surface, a portion of each of the plurality of conductive structures that is directly below the second portion of the dielectric layer has a second upper surface, and the first upper surface is lower than the second upper surface.

6. The semiconductor structure of claim 1, wherein the inner sub-spacer of the spacer structure comprises silicon nitride, and the outer sub-spacer of the spacer structure comprises silicon nitride.

7. The semiconductor structure of claim 1, wherein the dielectric layer comprises silicon nitride.

8. The semiconductor structure of claim 1, wherein each of the plurality of conductive structures comprises a metal layer, a metal silicide layer, and a polysilicon layer from top to bottom.

9. The semiconductor structure of claim 1, wherein each of the plurality of bitline structures comprises a dielectric layer, a metal layer, a metal nitride layer, and a polysilicon layer from top to bottom.

* * * * *